US009384992B2

(12) United States Patent
Narishige et al.

(10) Patent No.: US 9,384,992 B2
(45) Date of Patent: Jul. 5, 2016

(54) PLASMA PROCESSING METHOD

(71) Applicant: Tokyo Electron Limited, Tokyo (JP)

(72) Inventors: Kazuki Narishige, Miyagi (JP); Takanori Sato, Miyagi (JP); Manabu Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/373,658

(22) PCT Filed: Feb. 1, 2013

(86) PCT No.: PCT/JP2013/052415
§ 371 (c)(1),
(2) Date: Jul. 22, 2014

(87) PCT Pub. No.: WO2013/118660
PCT Pub. Date: Aug. 15, 2013

(65) Prior Publication Data
US 2015/0011094 A1    Jan. 8, 2015

Related U.S. Application Data

(60) Provisional application No. 61/597,876, filed on Feb. 13, 2012, provisional application No. 61/622,052, filed on Apr. 10, 2012.

(30) Foreign Application Priority Data

Feb. 9, 2012    (JP) .................................. 2012-025830
Apr. 5, 2012    (JP) .................................. 2012-086576

(51) Int. Cl.
*H01L 21/302*        (2006.01)
*H01L 21/461*        (2006.01)
(Continued)

(52) U.S. Cl.
CPC ....... *H01L 21/3065* (2013.01); *H01J 37/32091* (2013.01); *H01J 37/32165* (2013.01);
(Continued)

(58) Field of Classification Search
None
See application file for complete search history.

(56) References Cited

U.S. PATENT DOCUMENTS 5,830,807 A * 11/1998 Matsunaga ......... H01L 21/3065
                                                      216/68
6,187,685 B1 * 2/2001 Hopkins ........... H01L 21/30655
                                                      156/345.48

(Continued)

FOREIGN PATENT DOCUMENTS

JP     H07-263415      10/1995
JP     2006-148156     6/2006
(Continued)

*Primary Examiner* — Stephanie Duclair
(74) *Attorney, Agent, or Firm* — IPUSA, PLLC

(57) ABSTRACT

A plasma processing method is provided for etching a multilayer film having a first film and a second film with differing dielectric constants alternatingly stacked on a substrate, and forming a hole with a predetermined shape in the multilayer film. The plasma processing method includes a first step of etching the multilayer film to a first depth using a gas mixture containing a CF based gas at a first flow rate and a bromine-containing gas, a chloride-containing gas, and/or an iodine-containing gas; a second step of etching the multilayer film to a second depth after the first step using a gas mixture containing the CF based gas at a second flow rate and the bromine-containing gas, the chloride-containing gas, and/or the iodine-containing gas; and a third step for over etching the multilayer film after the second step until the hole reaches a base layer.

12 Claims, 13 Drawing Sheets

(51) Int. Cl.
| | |
|---|---|
| *H01L 21/3065* | (2006.01) |
| *H01L 21/308* | (2006.01) |
| *H01L 21/04* | (2006.01) |
| *H01L 21/311* | (2006.01) |
| *H01L 27/115* | (2006.01) |
| *H01L 21/3213* | (2006.01) |
| *H01J 37/32* | (2006.01) |
| *H01L 21/67* | (2006.01) |
| *H01L 21/683* | (2006.01) |

(52) U.S. Cl.
CPC ............ *H01L21/042* (2013.01); *H01L 21/308* (2013.01); *H01L 21/30655* (2013.01); *H01L 21/311* (2013.01); *H01L 21/31116* (2013.01); *H01L 21/32137* (2013.01); *H01L 21/67069* (2013.01); *H01L 27/11556* (2013.01); *H01L 27/11582* (2013.01); *H01L 21/67109* (2013.01); *H01L 21/6831* (2013.01)

(56) References Cited

U.S. PATENT DOCUMENTS

| | | | |
|---|---|---|---|
| 2008/0110859 A1* | 5/2008 | Koshiishi | H01J 37/32027 216/67 |
| 2013/0059450 A1* | 3/2013 | Le Gouil | H01L 21/3065 438/715 |

FOREIGN PATENT DOCUMENTS

| | | |
|---|---|---|
| JP | 2009-033080 | 2/2009 |
| JP | 2009-266944 | 11/2009 |

\* cited by examiner

FIG.6B

| | CONTINUOUS WAVEFORM | PULSED APPLICATION BY PULSE MODULATION | | |
|---|---|---|---|---|
| | | DUTY CYCLE 70% | DUTY CYCLE 60% | DUTY CYCLE 50% |
| RESIDUAL FILM OF PHOTORESIST LAYER (nm) | 51 | 74 | 143 | 194 |
| TOP CD (nm) | 61 | 62 | 62 | 63 |
| BOTTOM CD (nm) | 44 | 52 | 54 | 49 |
| DEPTH (nm) | 1951 | 1885 | 1886 | 1921 |

FIG.8B

|  | ETCHING PROCESS 1 | ETCHING PROCESS 2 | ETCHING PROCESS 3 | ETCHING PROCESS 4 |
|---|---|---|---|---|
|  | 3.2MHz | | 400kHz | |
|  | 4000W | 5300W | 4000W | 4500W |
| DEPTH (nm) | 1609 | 1711 | 1659 | 1849 |
| PHOTORESIST LAYER SELECTIVITY | 1.8 | 1.7 | 1.9 | 2.0 |

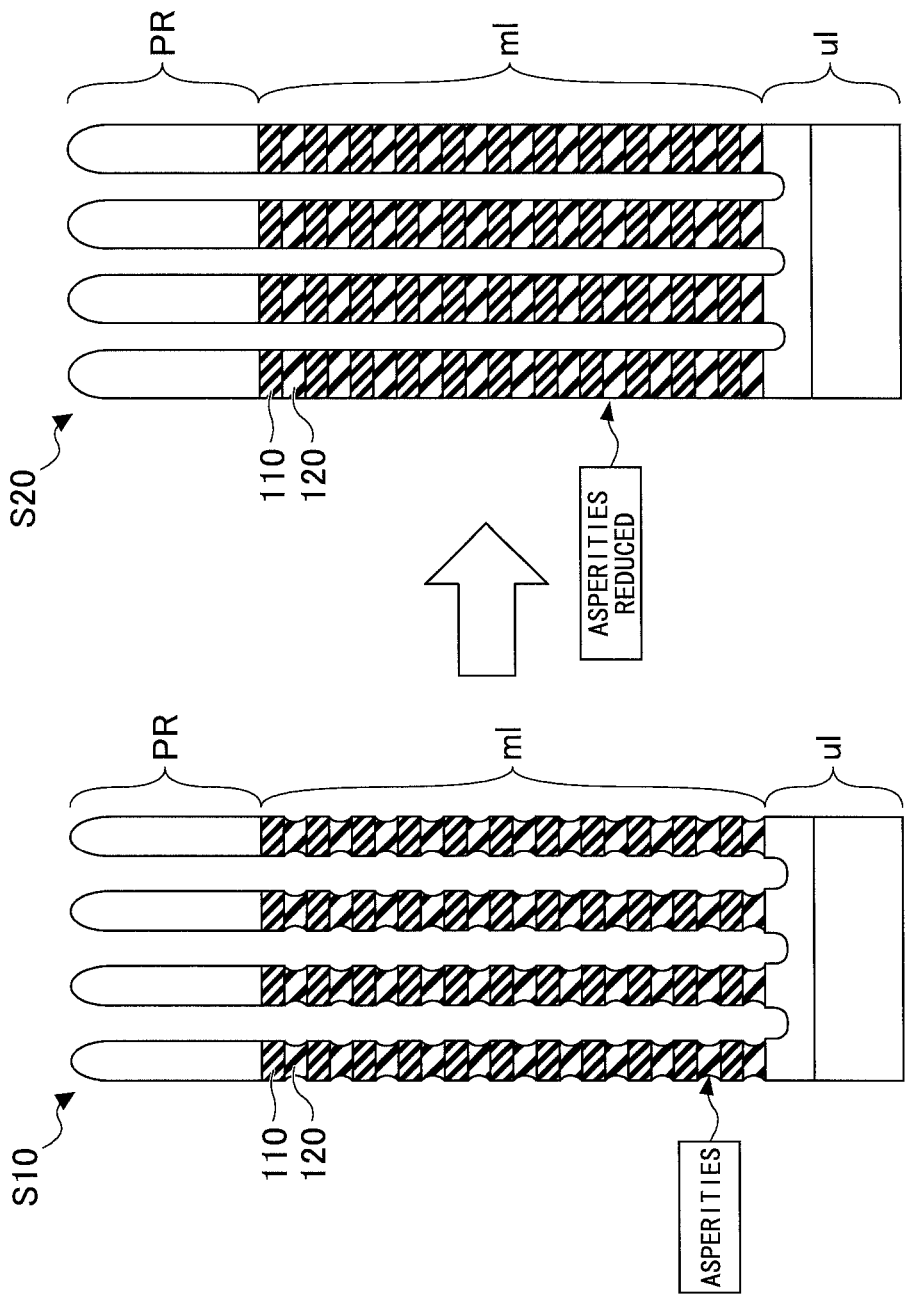

PLASMA PROCESSING METHOD

CROSS-REFERENCE TO RELATED APPLICATIONS

The present application is a National Stage of International Application No. PCT/JP2013/052415 filed on Feb. 1, 2013, claiming priority based on Japanese Patent Application No. 2012-025830 filed on Feb. 9, 2012; Japanese Patent Application No. 2012-086576 filed on Apr. 5, 2012; U.S. Provisional Application No. 61/597,876 filed on Feb. 13, 2012; and U.S. Provisional Application No. 61/622,052 filed on Apr. 10, 2012, the entire contents of which are hereby incorporated by reference.

TECHNICAL FIELD

The present invention relates to a manufacturing method of a semiconductor manufacturing apparatus and a semiconductor manufacturing apparatus.

BACKGROUND ART

Manufacturing a three-dimensional (3D) stacked semiconductor memory such as the 3D NAND flash memory includes an etching process for forming deep holes or deep trenches on a multilayer stacked film using a plasma (see e.g. Patent Document 1). Such an etching process may involve forming a hole or a trench that penetrates through all layers of a 16-layer stacked film or a 32-layer stacked film to reach a base film, for example.

PRIOR ART DOCUMENTS

Patent Documents

Patent Document 1: Japanese Laid-Open Patent Publication No. 2009-266944

SUMMARY OF THE INVENTION

Problem to be Solved by the Invention

However, in the above etching process, a photoresist layer that acts as a mask is also etched. Thus, as the number of layers of the stacked film increases, and as the hole or trench to be etched becomes deeper, there is an increased possibility for the photoresist layer to disappear during the etching process before the hole or trench reaches the base film. Accordingly, measures need to be implemented to increase the selectivity of the photoresist layer representing the ratio of the etching rate of the photoresist layer with respect to the etching rate of the stacked film (simply referred to as "photoresist layer selectivity" hereinafter) in order to prevent the photoresist layer from disappearing before the deep hole or deep trench reaches the base film.

Also, as the hole to be etched becomes deeper, it becomes increasingly difficult for ions to reach the bottom portion of the hole or trench. As a result, the critical dimension (CD) at the bottom portion of the hole may become smaller than a prescribed value. In view of the above, there is a demand for an etching technique for securing a desired CD even at the bottom portion of the hole (bottom DC).

Thus, one aspect of the present invention relates to providing a manufacturing method of a semiconductor manufacturing apparatus and a semiconductor manufacturing apparatus that are capable of increasing the photoresist layer selectivity and maintaining a desired CD.

Means for Solving the Problem

According to one embodiment of the present invention, a manufacturing method of a semiconductor manufacturing apparatus is provided for etching a multilayer film using a plasma, the multilayer film having a first film and a second film with differing dielectric constants alternatingly stacked on a substrate, and forming a hole or a trench with a predetermined shape in the multilayer film. The manufacturing method includes applying to a lower electrode, which is arranged opposite an upper electrode, a first high frequency power for plasma generation that is greater than or equal to 27 MHz, and a second high frequency power for biasing that is greater than or equal to 380 kHz and less than or equal to 1 MHz; a first step of etching the multilayer film to a first depth using plasma generated from a gas mixture containing a CF based gas at a first flow rate and a gas including at least one of a bromine-containing gas, a chloride-containing gas, and an iodine-containing gas; a second step of etching the multilayer film after the first step, the second step including etching the multilayer film to a second depth, which differs from the first depth, using plasma generated from a gas mixture containing the CF based gas at a second flow rate, which differs from the first flow rate, and the gas including at least one of the bromine-containing gas, the chloride-containing gas, and the iodine-containing gas; and a third step of over etching the multilayer film after the second step until the hole or the trench reaches a base layer of the multilayer film.

According to another embodiment of the present invention, a semiconductor manufacturing apparatus is provided that is configured to etch a multilayer film having a first film and a second film with differing dielectric constants stacked on a substrate using a generated plasma, and form a hole or a trench with a predetermined shape in the multilayer film. The semiconductor manufacturing apparatus includes a lower electrode arranged opposite an upper electrode, a first high frequency power supply configured to apply to the lower electrode a first high frequency power for plasma generation that is greater than or equal to 27 MHz, a second high frequency power supply configured to apply to the lower electrode a second high frequency power for biasing that is greater than or equal to 380 kHz and less than or equal to 1 MHz, and a control device. The control device executes a first step of etching the multilayer film to a first depth using plasma generated from a gas mixture containing a CF based gas at a first flow rate and a gas including at least one of a bromine-containing gas, a chloride-containing gas, and an iodine-containing gas; a second step of etching the multilayer film after the first step, the second step including etching the multilayer film to a second depth, which differs from the first depth, using a plasma generated from a gas mixture containing the CF based gas at a second flow rate, which differs from the first flow rate, and the gas including at least one of the bromine-containing gas, the chloride-containing gas, and the iodine-containing gas; and a third step of over etching the multilayer film after the second step until the hole or the trench reaches a base layer of the multilayer film.

Advantageous Effect of the Invention

According to an aspect of the present invention, a manufacturing method of a semiconductor manufacturing apparatus and a semiconductor manufacturing apparatus may be provided that are capable of increasing the photoresist layer selectivity and maintaining a desired CD.

BRIEF DESCRIPTION OF THE DRAWINGS

FIG. 6B is a table representing the results of the etching process according to the embodiment;

FIG. 8B is a table representing the results of the etching process of the embodiment when different frequencies and powers are used;

FIG. 10 illustrates a result of an etching process according to a modified embodiment.

EMBODIMENTS FOR IMPLEMENTING THE INVENTION

Figure 1:
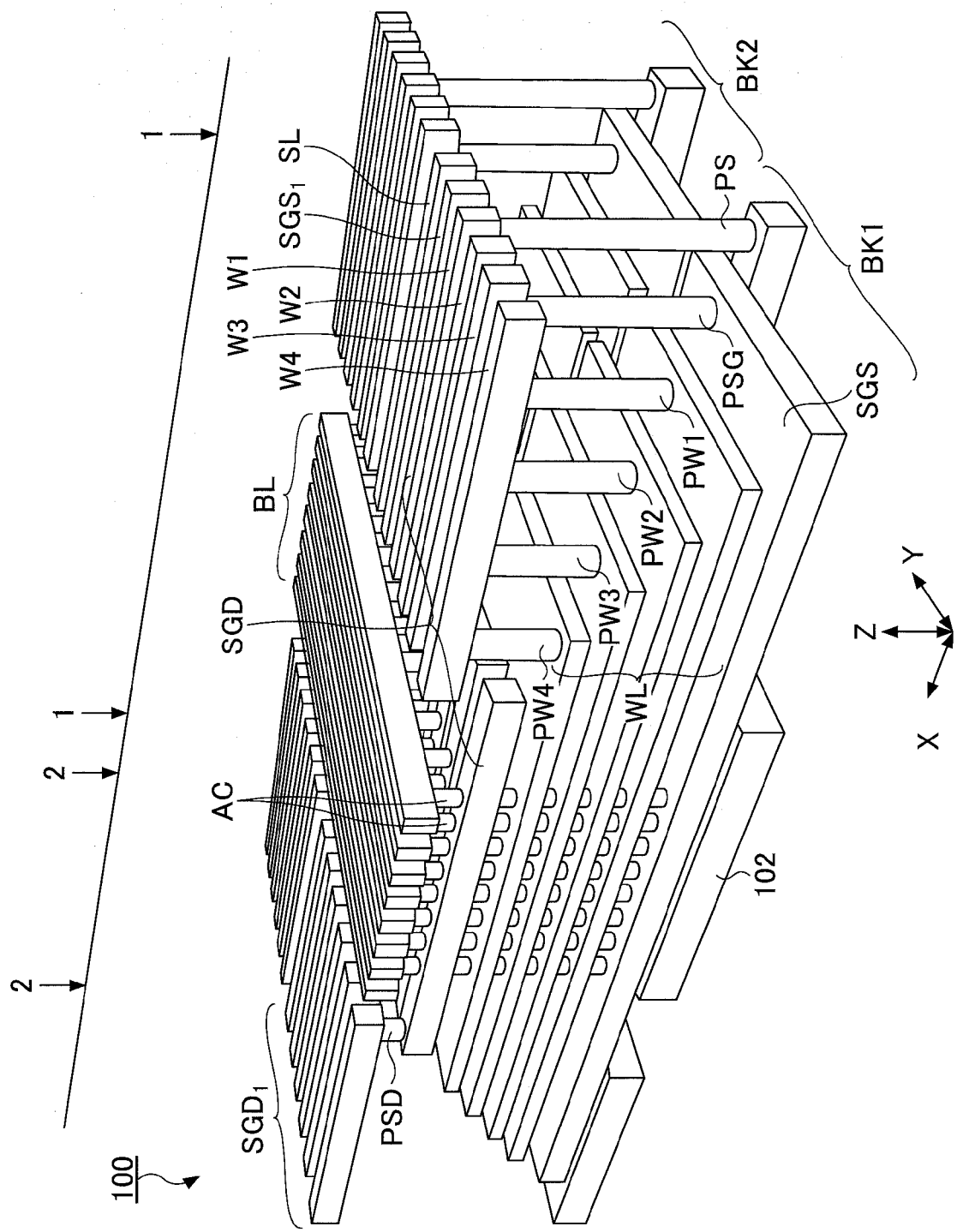
FIG. 1 schematically illustrates a configuration of a 3D stacked semiconductor memory according to an embodiment of the present invention.

In the following, embodiments of the present invention are described with reference to the accompanying drawings. Note that elements having substantially the same functions or features may be given the same reference numerals and overlapping descriptions thereof may be omitted.

[Configuration of 3D Stacked Semiconductor Memory]

Figure 2A:
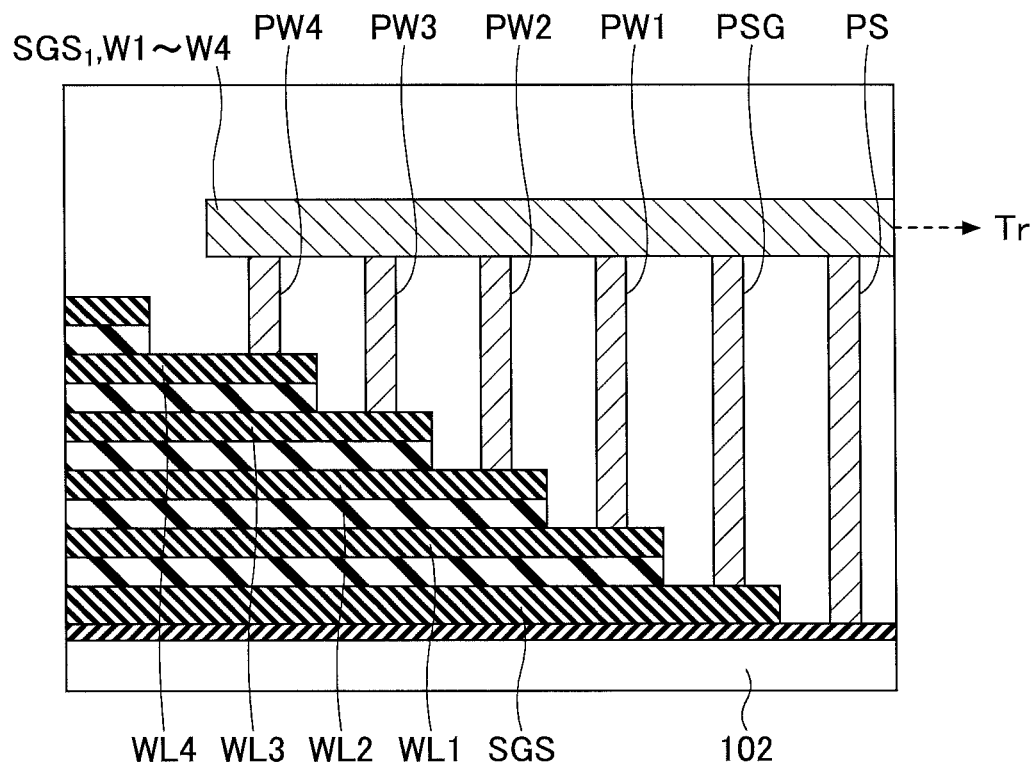
FIG. 2A is a cross-sectional view along line 1-1 of FIG. 1.
Figure 2B:
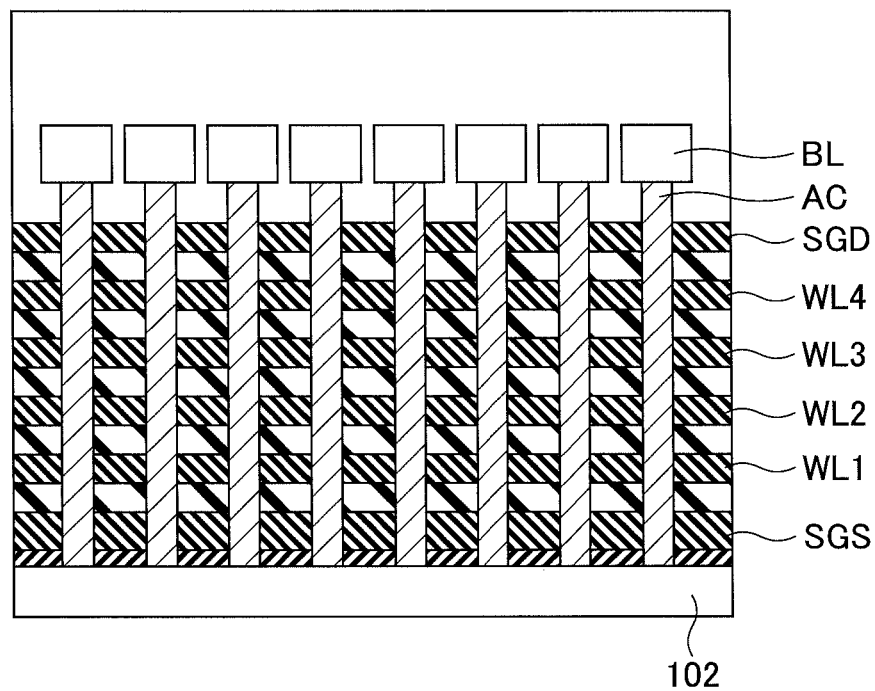
FIG. 2B is a cross-sectional view along line 2-2 of FIG. 1.

In the following, an example of a 3D stacked semiconductor memory produced using a manufacturing method of a semiconductor manufacturing apparatus according to an embodiment of the present invention is described with reference to FIGS. 1, 2A, and 2B. FIG. 1 is a perspective view schematically illustrating a configuration of 3D NAND flash memory. FIG. 2A is a cross-sectional view along line 1-1 of the 3D NAND flash memory illustrated in FIG. 1. FIG. 2B is a cross-sectional view along line 2-2 of the 3D NAND flash memory illustrated in FIG. 1. The 3D NAND flash memory is an example of a 3D stacked semiconductor memory.

The 3D NAND flash memory 100 illustrated in FIG. 1 is made up of a plurality of blocks each constituting a unit for erasure, for example. In FIG. 1, two blocks BK1 and BK2 are illustrated. A source diffusion layer 102 formed within a semiconductor substrate may be provided as a common layer for all the blocks of the 3D NAND flash memory 100, for example. The source diffusion layer 102 is connected to a source line SL via a contact plug PS. A first film and a second film having differing relative dielectric constants may be alternatingly stacked on the source diffusion layer 102 to form a stacked multilayer film, for example. Note that although the multilayer film is illustrated by a 6-layer structure in FIG. 1 for the sake of convenience, the multilayer film be made up of 16 layers, 32 layers, or even more layers.

In FIG. 1, five films corresponding to the five layers other than the uppermost layer of the multilayer structure are arranged into plates within each of the blocks BK1 and BK2, and their X-direction end portions are arranged into a stepped configuration in order to establish contact with each of the films. In this way, the multilayer film is arranged into a pyramid shape. The lowermost layer of the multilayer film corresponds to a source line side select gate line SGS, and the four layers other than the lowermost layer and the uppermost layer correspond to word lines WL.

The uppermost layer is made up of a plurality of conductive lines extending in the X direction. For example, six conductive lines may be arranged within one block BK1. For example, the six conductive lines of the uppermost layer may correspond to six bit line side select gate lines SGD.

A plurality of active layers AC for configuring a NAND cell unit are arranged in to columns extending in the Z direction (i.e. vertical direction with respect to semiconductor substrate surface) to penetrate through the plurality of layers and reach the source diffusion layer 102.

A plurality of bit lines BL extending in the Y direction are connected to the upper ends of the plurality of active layers AC. Also, the source line side select gate line SGS is connected to a leader line $SGS_1$ extending in the X direction via a contact plug PSG. The word lines WL are connected to leader lines W1-W4 extending in the X direction via contact plugs PW1-PW4.

Further, the bit line side select gate lines SGD are connected to leader lines $SGD_1$ extending in the X direction via contact plugs PSD. The plurality of bit lines BL, the leader lines $SGD_1$, the leader lines WL1-WL4 may be made of metal, for example.

FIG. 2A is a cross-sectional view along line 1-1 of FIG. 1. The source line side select gate line SGS and word lines WL1-WL4 are connected to a transistor Tr included in a driver (not shown) via the contact plug PSG and the contact plugs PW1-PW4, which establish connection with the leader line $SGS_1$ and the leader lines W1-W4 extending in the X direction.

FIG. 2B is a cross-sectional view along line 2-2 of FIG. 1. The plurality of active layers AC for configuring the NAND cell unit are arranged into columns extending in the Z direction (vertical direction with respect to the semiconductor substrate surface) to penetrate through the plurality of films SGD, WL4, WL3, WL2, WL1, and SGS and reach the source diffusion layer 102. In an etching process described below, deep holes are created to form the plurality of active layers.

[Overall Configuration of Plasma Processing Apparatus]

Figure 3:
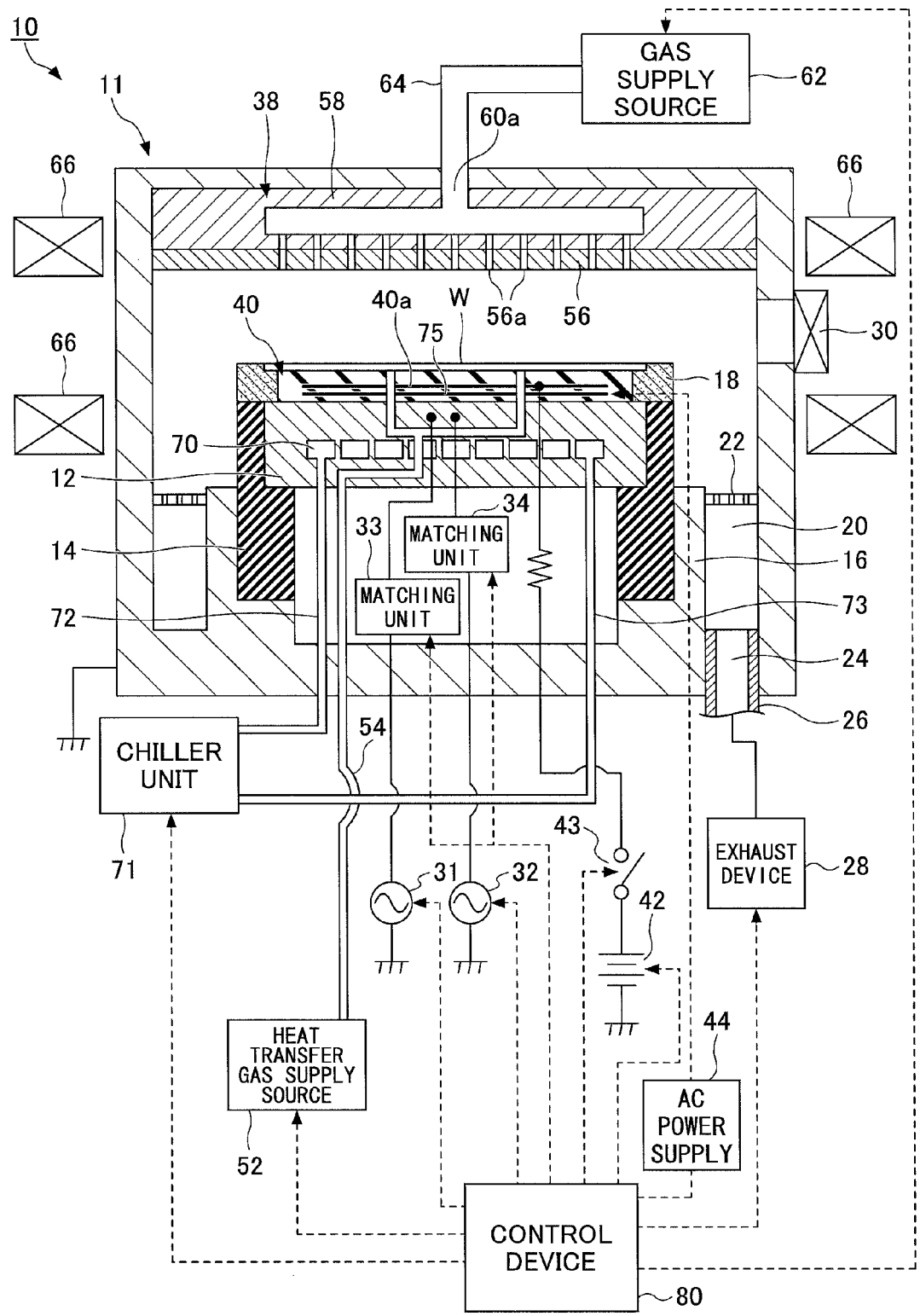
FIG. 3 is a longitudinal cross-sectional view illustrating an overall configuration of a semiconductor manufacturing apparatus according to the embodiment.

In the following, an overall configuration of a plasma processing apparatus as an example of a semiconductor manufacturing apparatus is described with reference to FIG. 3. The plasma processing apparatus 10 illustrated in FIG. 3 is configured as a dual frequency parallel plate type (capacitively coupled) plasma etching apparatus. The plasma processing apparatus 10 includes a cylindrical vacuum chamber (processing chamber) 11 (simply referred to as "chamber" hereinafter) made of aluminum having an alumite-treated (anodized) surface, for example. The chamber 11 may be grounded, for example. A mounting table 12 configured to hold a semiconductor wafer W (hereinafter, simply referred to as a "wafer W") thereon as a workpiece is arranged within the chamber 11. The mounting table 12 may be made of aluminum, for example, and is supported on a cylindrical support 16 via an insulating cylindrical holder 14. The cylindrical support 16 extends vertically upward from a bottom of the chamber 11. To improve in-plane etching uniformity, a focus ring 18 that may be made of silicon, for example, is arranged on a top surface of the mounting table to surround the outer edge of an electrostatic chuck 40.

An exhaust path 20 is formed between a sidewall of the chamber 11 and the cylindrical support 16. A ring-shaped baffle plate 22 is arranged in the exhaust path 20. An exhaust port 24 is formed at a bottom portion of the exhaust path 20 and is connected to an exhaust device 28 via an exhaust line 26. The exhaust device 28 includes a vacuum pump (not shown) and is configured to depressurize a processing space within the chamber 11 to a predetermined vacuum level. A gate valve 30 configured to open/close an entry/exit port for the wafer W is provided at the sidewall of the chamber 11.

A first high frequency power supply 32 for plasma generation and a second high frequency power supply 31 for drawing ions from within the plasma (for biasing) are electrically connected to the mounting table 12 via a matching unit 34 and a matching unit 33, respectively.

The first high frequency power supply 32 is configured to apply to the mounting table 12 a first high frequency power having a suitable frequency for generating a plasma within the chamber 11 such as 27-60 MHz, for example. The second high frequency power supply 31 is configured to apply to the mounting table 12 a second high frequency power having a lower frequency suitable for drawing ions from within the plasma onto the wafer W placed on the mounting table 12 such as 380 KHz-1 MHz, for example. In this way, the mounting table 12 also acts as a lower electrode. Further, a shower head 38, which is described below, is provided at a ceiling portion of the chamber 11. The shower head 38 acts as an upper electrode at a ground potential. In this way, the first high frequency power from the first high frequency power supply 32 is capacitively applied between the mounting table 12 and the shower head 38.

The electrostatic chuck 40 configured to hold the wafer W by an electrostatic attractive force is provided on the top surface of the mounting table 12. The electrostatic chuck 40 includes an electrode 40a that is made of a conductive film and is arranged between a pair of films. A DC voltage supply 42 is electrically connected to the electrode 40a via a switch 43. The electrostatic chuck 40 electrostatically attracts and holds the wafer W by a Coulomb force that is generated when a voltage is applied thereto from the DC voltage supply 42.

A heat transfer gas supply source 52 is configured to supply a heat transfer gas such as He gas or Ar gas between the backside surface of the wafer W and the top surface of the electrostatic chuck 40 through a gas supply line 54.

The shower head 38 disposed at the ceiling portion of the chamber 11 includes an electrode plate 56 having multiple gas holes 56a and an electrode supporting body 58 configured to detachably hold the electrode plate 56. The gas supply source 62 supplies gas to the shower head 38 via a gas supply pipe 64, which is connected to a gas inlet 60a. In this way, the gas may be introduced into the chamber 11 from the multiple gas holes 56a.

A magnet 66 is arranged to extend annularly or concentrically around the chamber 11 such that the magnetic force of the magnet 66 may act to keep plasma confined within a plasma generation space of the chamber 11.

A coolant path 70 is formed within the mounting table 12. A coolant cooled to a predetermined temperature is supplied to the coolant path 70 from a chiller unit 71 via pipes 72 and 73. Also, a heater 75 is arranged at the lower side of the electrostatic chuck 40. A desired AC voltage is applied to the heater 75 from an AC power supply 44. In this way, the temperature of the wafer W may be adjusted to a desired temperature though cooling by the chiller unit 71 and heating by the heater 75. Note that such temperature control is performed based on a command from a control device 80.

The control device 80 is configured to control the individual components of the plasma processing apparatus 10 such as the exhaust device 28, the AC power supply 44, the DC voltage supply 42, the switch 43 for the electrostatic chuck, the first high frequency power supply 32, the second high frequency power supply 31, the matching units 33 and 34, the heat transfer gas supply source 52, the gas supply source 62, and the chiller unit 71. Note that the control device 80 is also connected to a host computer (not shown).

The control device 80 includes a CPU (Central Processing Unit), a ROM (Read Only Memory), and a RAM (Random Access Memory), which are not shown. The CPU executes a plasma process according to various recipes stored in a storage unit (not shown). The storage unit storing the recipes may be configured by RAM or ROM using a semiconductor memory, a magnetic disk, or an optical disk, for example. The recipes may be stored in a storage medium and loaded in the storage unit via a driver, for example. Alternatively, the recipes may be downloaded to the storage unit via a network (not shown), for example. Also, note that a DSP (digital signal processor) may be used instead of the CPU to perform the above functions. The functions of the control device 80 may be implemented by software, hardware, or a combination thereof.

When performing an etching process using the plasma processing apparatus 10 having the above-described configuration, first, the gate valve 30 is opened, and the wafer W is loaded into the chamber 11 while being held by a transfer arm. Then, the wafer W is lifted from the transfer aim by pusher pins (not shown), and the wafer W is placed on the electrostatic chuck 40 when the pusher pins are lowered. After the wafer W is loaded, the gate valve 30 is closed. Then, an etching gas is introduced into the chamber 11 from the gas supply source 62 at a predetermined flow rate and flow rate ratio, and the internal pressure of the chamber 11 is reduced to a predetermined pressure by the exhaust device 28. Further, the second high frequency power for biasing from the second high frequency power supply 31 and the first high frequency power for plasma generation from the first high frequency power supply 32 are supplied to the mounting table 12. Also, a voltage from the DC voltage supply 42 is applied to the electrode 40a of the electrostatic chuck 40 so that the wafer W may be fixed to the electrostatic chuck 40. The heat transfer gas supply source 52 supplies a heat transfer gas such as He gas between the top surface of the electrostatic chuck 40 and the backside surface of the wafer W. Etching gas sprayed into the chamber 11 from the shower head 38 is excited into a plasma by the first high frequency power from the first high frequency power supply 32. As a result, plasma is generated within the plasma generation space between the upper electrode (shower head 38) and the lower electrode (mounting table 12), and a main surface of the wafer W is etched by the generated plasma. Also, ions within the plasma may be drawn toward the wafer W by the second high frequency power from the second high frequency power supply 31.

After plasma etching is completed, the wafer W is lifted and held by the pusher pins, the gate valve 30 is opened, and the transfer arm is introduced into the chamber 11. Then, the pusher pins are lowered so that the wafer W may be held by the transfer arm. Then, the transfer arm exits the chamber 11, and a next wafer W is loaded into the chamber 11 by the transfer arm. By repeating the above-described procedures, wafers W may be successively processed.

[Stacked Film Etching Process]

Figure 4:
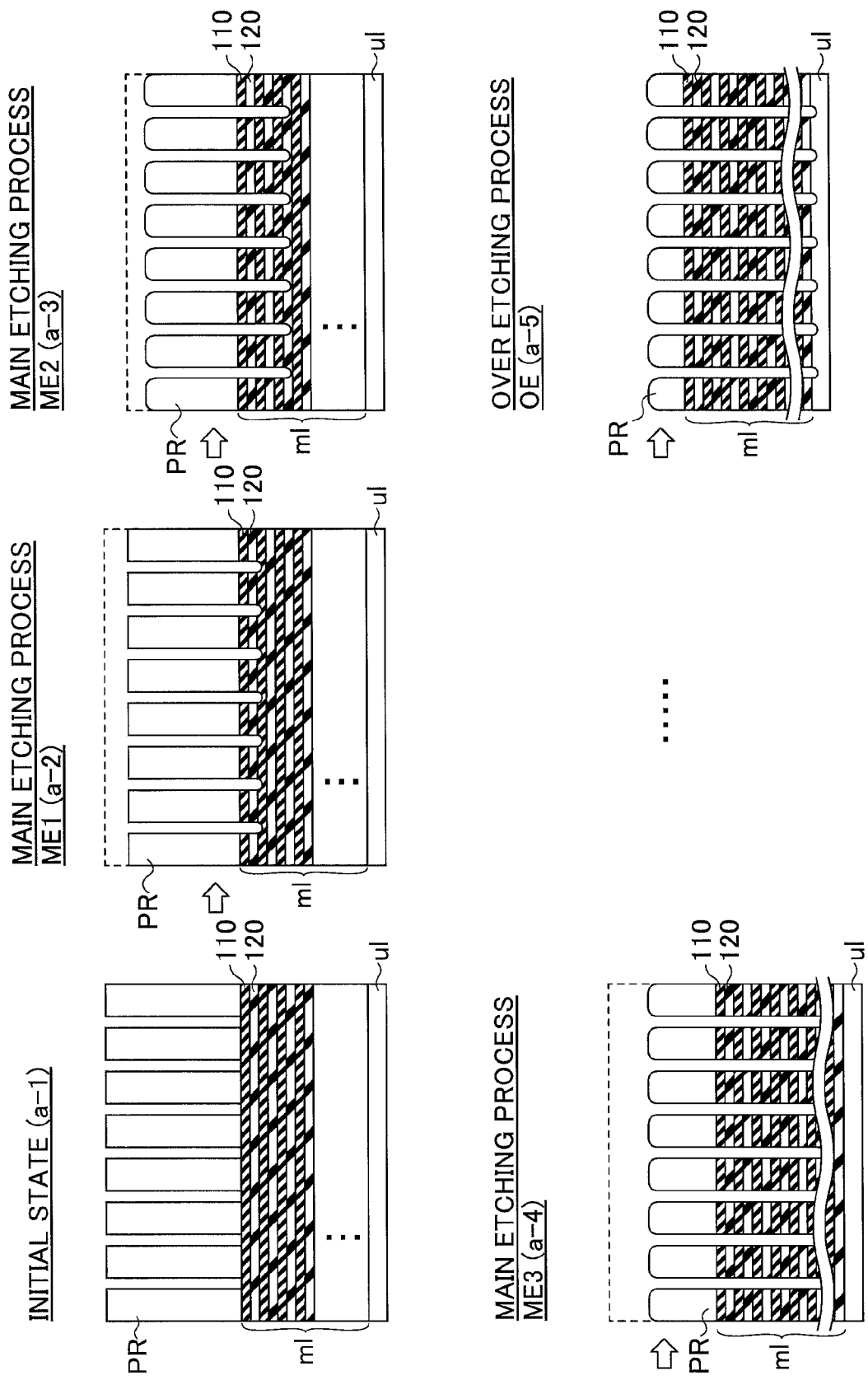
FIG. 4 illustrates an etching process and a configuration of a stacked film according to the embodiment.

In the following, an etching process for etching a stacked film (multilayer film) according to an embodiment of the present invention is described with reference to FIG. 4. FIG. 4 illustrates the etching process and a configuration of the stacked film subject to the etching process of the present embodiment.

<Initial State (a-1) Before Etching Process>

First, an initial state of the stacked film before the etching process is performed is described. In the present embodiment, a 36-layer multilayer film ml having a first film 110 and a second film 120 alternatingly stacked on a base film ul is formed. Note that the multilayer film ml may be a stacked film having at least 20 layers of the first film 110 and the second film 120 alternatingly arranged one on top of each other, for example.

The first film 110 and the second film 120 are films having differing relative dielectric constants. In the present embodiment, a silicon oxide ($SiO_2$) film is used as the first film 110 and a polysilicon (impurity doped) film is used as the second film 120 to form the multilayer film ml made up of films having differing dielectric constants.

Note, however, that the combination of the first film 110 and the second film 120 is not limited to the above silicon oxide ($SiO_2$) film/polysilicon (impurity doped) film combination. In one alternative example, a polysilicon (non-doped) film may be used as the first film 110 and a polysilicon (impurity doped) film may be used as the second film 120. In this case, the first film 110 and the second film 120 have differing dielectric constants based on whether impurities are doped. For example, a material such as boron may be doped as an impurity.

As other exemplary combinations of the first film 110 and the second film 120, a silicon oxide ($SiO_2$) film may be used as the first film 110 and a silicon nitride (SiN) film may be used as the second film 120, or a silicon oxide ($SiO_2$) film may be used as the first film 110 and a polysilicon (non-doped) film may be used as the second film 120.

A photoresist layer PR that acts as a mask is arranged directly above the multilayer film ml. A desired pattern is formed on the photoresist layer PR. The photoresist layer PR may be made of an organic film or an amorphous carbon film, for example. Also, the photoresist layer PR may be an i-line (365 nm wavelength) photoresist layer, for example.

The etching process of the present embodiment may be executed to form the plurality of active layers AC illustrated in FIG. 1, for example. That is, the etching process of the present embodiment may be implemented as a process for forming holes that penetrate through the multiple layers of a stacked film. In the following, the process steps of such an etching process are described with reference to FIG. 4.

<Main Etching Process (a-2) through Over Etching Process (a-5)>

In the present embodiment, four main etching processes ME1-ME4 are performed, after which an over etching process OE is performed. The main etching process is primarily a process for etching a hole in the vertical direction. The over etching process OE is a process for enlarging a bottom CD of a bottom portion of the hole. Note that in FIG. 4, the main etching process ME1 (a-2), the main etching process ME2 (a-3), the main etching process ME3 (a-4), and the over etching process OE4 (a-5) are illustrated. Although an illustration of the main etching process ME4 (a-*) is omitted in FIG. 4, the number of times an etching process is executed may be increased as the depth of the hole to be etched in the stacked film is increased.

The following process conditions for the above processes may be stored in a recipe, and the etching process of the present embodiment may be executed according to the recipe.

<Main Etching Process ME1 (a-2)>

| | |
|---|---|
| Pressure | 50 mTorr (6.6661 Pa) |
| First High Frequency Power/ | 2000/4500 W |
| Second High Frequency Power | (283.1/636.9 W/cm$^2$) |
| Gas Type & Gas Flow Rate | HBr/C$_4$F$_8$/Ar = |
| | 496/30/100 sccm |

<Main Etching Process ME2 (a-3)>

| | |
|---|---|
| Pressure | 50 mTorr |
| First High Frequency Power/ | 2000/4500 W |
| Second High Frequency Power | |
| Gas Type & Gas Flow Rate | HBr/C$_4$F$_8$/Ar = |
| | 496/29/100 sccm |

<Main Etching Process ME3 (a-4)>

| | |
|---|---|
| Pressure | 50 mTorr |
| First High Frequency Power/ | 2000/4500 W |
| Second High Frequency Power | |
| Gas Type & Gas Flow Rate | HBr/C$_4$F$_8$/Ar = |
| | 496/28/100 sccm |

<Main Etching Process ME4 (a-*)>

| | |
|---|---|
| Pressure | 50 mTorr |
| First High Frequency Power/ | 2000/4500 W |
| Second High Frequency Power | |
| Gas Type & Gas Flow Rate | HBr/C$_4$F$_8$/Ar = |
| | 496/27/100 sccm |

<Over Etching Process OE (a-5)>

| | |
|---|---|
| Pressure | 50 mTorr |
| First High Frequency Power/ | 1500/1000 W (212.3/141.5 |
| Second High Frequency Power | W/cm$^2$) |
| Gas Type & Gas Flow Rate | HBr/Ar/NF$_3$/CH$_4$ = |
| | 450/450/25/60 sccm |

In the present embodiment, $C_4F_8$ gas is used as an etching gas for etching the silicon oxide ($SiO_2$) film corresponding to the first film 110, and HBr gas is used as an etching gas for etching the polysilicon (impurity doped) film corresponding to the second film 120. Note that Ar gas does not necessarily have to be included in the gas mixture used in the above etching processes.

The main etching processes ME are successively performed starting from the main etching process ME1, followed by the main etching process ME2, the main etching process ME3, and the main etching process ME4 so that the stacked film may be gradually etched. The $C_4F_8$ gas included in the etching gas used in the main etching processes ME contains carbon. When the etching gas contains a large amount of carbon, the carbon tends to accumulate on a wall surface of the hole formed in the stacked film, and as the etching process progresses, etching the stacked film may become increasingly difficult. As a result, the hole may become narrower particularly at the bottom portion, and the bottom CD may become smaller than a prescribed value. In light of the above, according to the above recipe, the flow rate of the $C_4F_8$ gas is gradually decreased as the main etching process ME progresses so that the accumulation of carbon may be suppressed and a desired CD (radius) may be secured for the bottom CD.

Note that the etching gas for etching the polysilicon (impurity doped) film corresponding to the second film 120 is not limited to a bromine-containing gas such as hydrogen bromide (HBr) gas but may be any gas including at least one of a bromine-containing gas, a chlorine-containing gas, and an iodine-containing gas.

Note, also, that the power supplied during the main etching process ME differs from the power supplied during the over etching process OE. That is, isotropic etching is desirably executed during the over etching process OE so that the bottom CD at the bottom portion of the hole may be enlarged. Thus, in the over etching process OE the second high frequency power corresponding to the high frequency power for biasing is reduced from 4500 W to 1000 W. Also, the second high frequency power is reduced to 1000 W to protect the base film. Further, in the over etching process OE, $NF_3$ gas and $CH_4$ gas are supplied as etching gases to facilitate etching in the lateral direction for enlarging the bottom CD.

Note that the main etching process ME1 corresponds to an example of a first step of etching the multilayer film to a first depth using a gas mixture containing a CF based gas at a first flow rate and a gas including at least one of a bromine-containing gas, a chlorine-containing gas, and an iodine-containing gas.

Also, the main etching process ME2 corresponds to an example of a second step of etching the multilayer film after the first step, the second step including etching the multilayer film to a second depth, which differs from the first depth, using a gas mixture containing the CF based gas at a second flow rate, which differs from the first flow rate, and the gas including at least one of the bromine-containing gas, the chlorine-containing gas, and the iodine-containing gas. The second flow rate of the CF based gas supplied in the second step is lower than the first flow rate of the CF based gas supplied in the first step.

Also, the over etching process OE corresponds to an example of a third step of over etching the multilayer after the first step and the second step until the hole or the trench reaches a base layer of the multilayer film.

Also, the main etching processes ME3 and ME4 correspond to examples of a fourth step of etching the multilayer film after the first step and the second step, and before the third step, the fourth step including etching the multilayer film to a third depth using a gas mixture containing the CF based gas at a third flow rate and the gas including at least one of the bromine-containing gas, the chlorine-containing gas, and the iodine-containing gas. The third flow rate of the CF based gas supplied in the fourth step is even lower than the second flow rate of the CF based gas supplied in the second step.

[Manufacturing Method of Semiconductor Manufacturing Apparatus]

Figure 5:
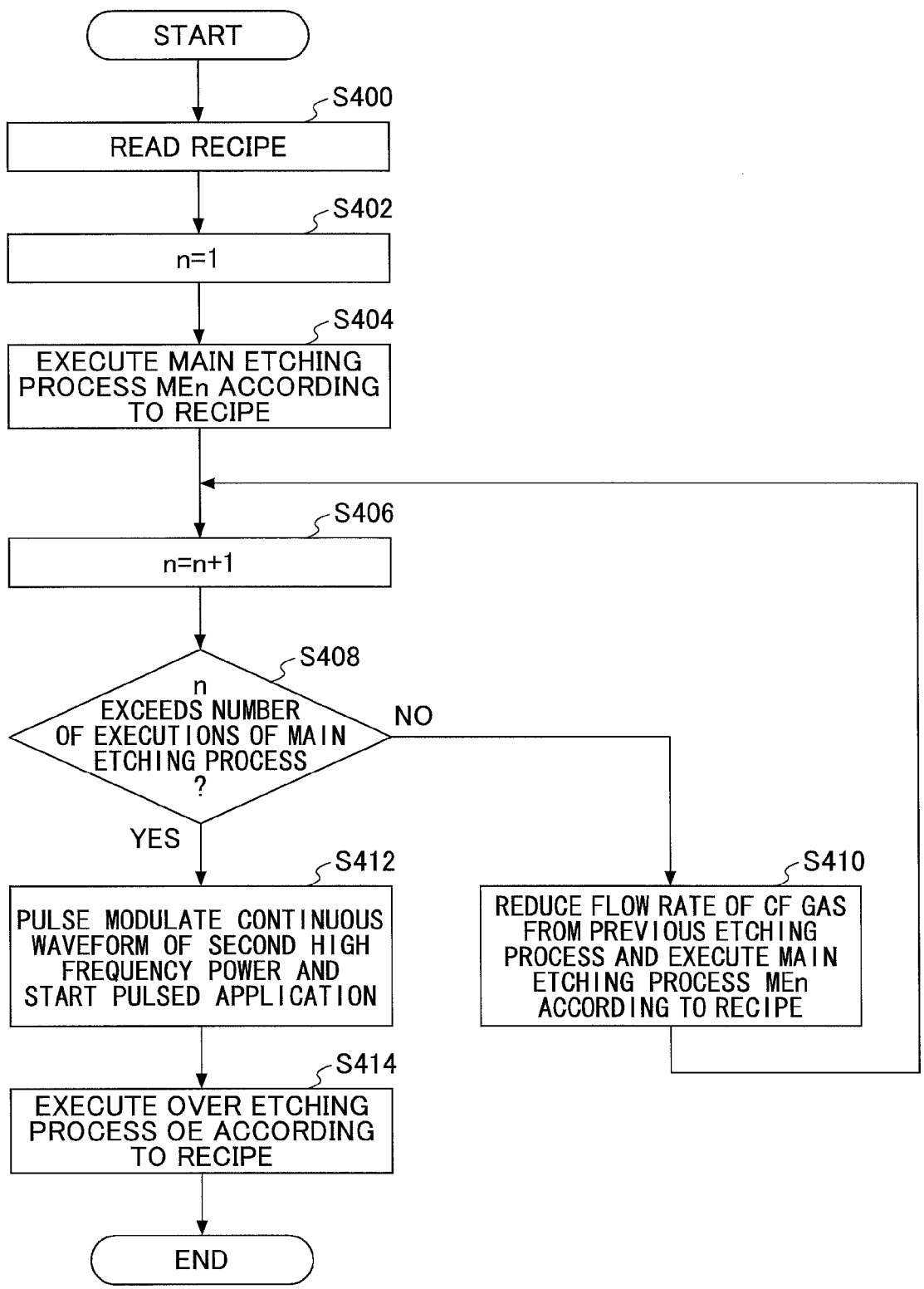
FIG. 5 is a flowchart illustrating process steps of the etching process according to the embodiment.

In the following, a manufacturing method of a semiconductor manufacturing apparatus according to an embodiment of the present invention is described with reference to FIG. 5. FIG. 5 is a flowchart illustrating process steps of an etching process that is executed in the present embodiment.

The etching process according to the present embodiment is executed by the control device 80 based on the above recipe that is stored in a storage unit (not shown). When the etching process of the present embodiment is started, first, in step S400, the above recipe is read from the storage unit (step S400).

Next, the value "1" is assigned to "n" representing the number of the main etching process (step S402). Next, the main etching process MEn is executed according to the recipe read in step S400 (step S404). In the case where n=1, the main etching process ME1 is executed. As a result, a plurality of holes are formed in the stacked film as illustrated in the main etching process ME1 (a-2) of FIG. 4.

Next, the value of n representing the number of the main etching process is incremented by 1 (n=n+1) (step S406). At this point, the value of n representing the number of the main etching process is changed to "2". Then, a determination is made as to whether the number of the main etching processes n has exceeded the number of times the main etching process is to be executed (step S408). In the present embodiment, the number of times the main etching process is to be executed is "4". Accordingly, when the number of the main etching process n=2, it is determined that the value of n has not exceeded the number of times the main etching process is to be executed. Thus, in accordance with the above recipe, the main etching process MEn is executed by reducing the flow rate of the CF based gas compared to the previous main etching process ME1 (step S410). Note that the main etching process ME2 is executed in the above case. As a result, the plurality of holes formed in the stacked film becomes deeper as illustrated in the main etching process ME2 (a-3) of FIG. 4.

Next, the process goes back to step S406, and the value of n is incremented by "1" (step S406). At this point, the value of the number of main etching processes n is changed to "3". Next, a determination is made as to whether the number of main etching processes n has exceeded the number of times the main etching process is to be executed (step S408). When the number of main etching processes n=3, it is determined that the value of n has not exceeded the number of times the main etching process is to be executed. Thus, in accordance with the above recipe, the main etching process MEn is executed by reducing the flow rate of the CF based gas compared to the previous main etching process ME2 (step S410). Note that the main etching process ME3 is executed in the above case. As a result, the plurality of holes formed in the stacked film becomes even deeper as illustrated in the main etching process ME3 (a-4) of FIG. 4.

Steps S406-S410 are further repeated to execute the main etching process ME4. Thereafter, the process goes back to step S406 and the value of n is incremented by "1". At this point the number of the main etching processes n is changed to "5", and accordingly, it is determined that the value of n has exceeded the number of times the main etching process is to be executed (step S408).

Accordingly, the process proceeds to step S412, where a continuous waveform of the second high frequency power for biasing is pulse modulated to start pulsed application of the second high frequency power (step S412), and the over etching process OE is executed according to the above recipe read from the storage unit (step S414). As a result, the plurality of holes formed in the stacked film (multilayer film ml) reach a base layer of the stacked film as illustrated in the over etching process OE (a-5) of FIG. 4.

Experimental Results

Pulsed Modulation

Figure 6A:
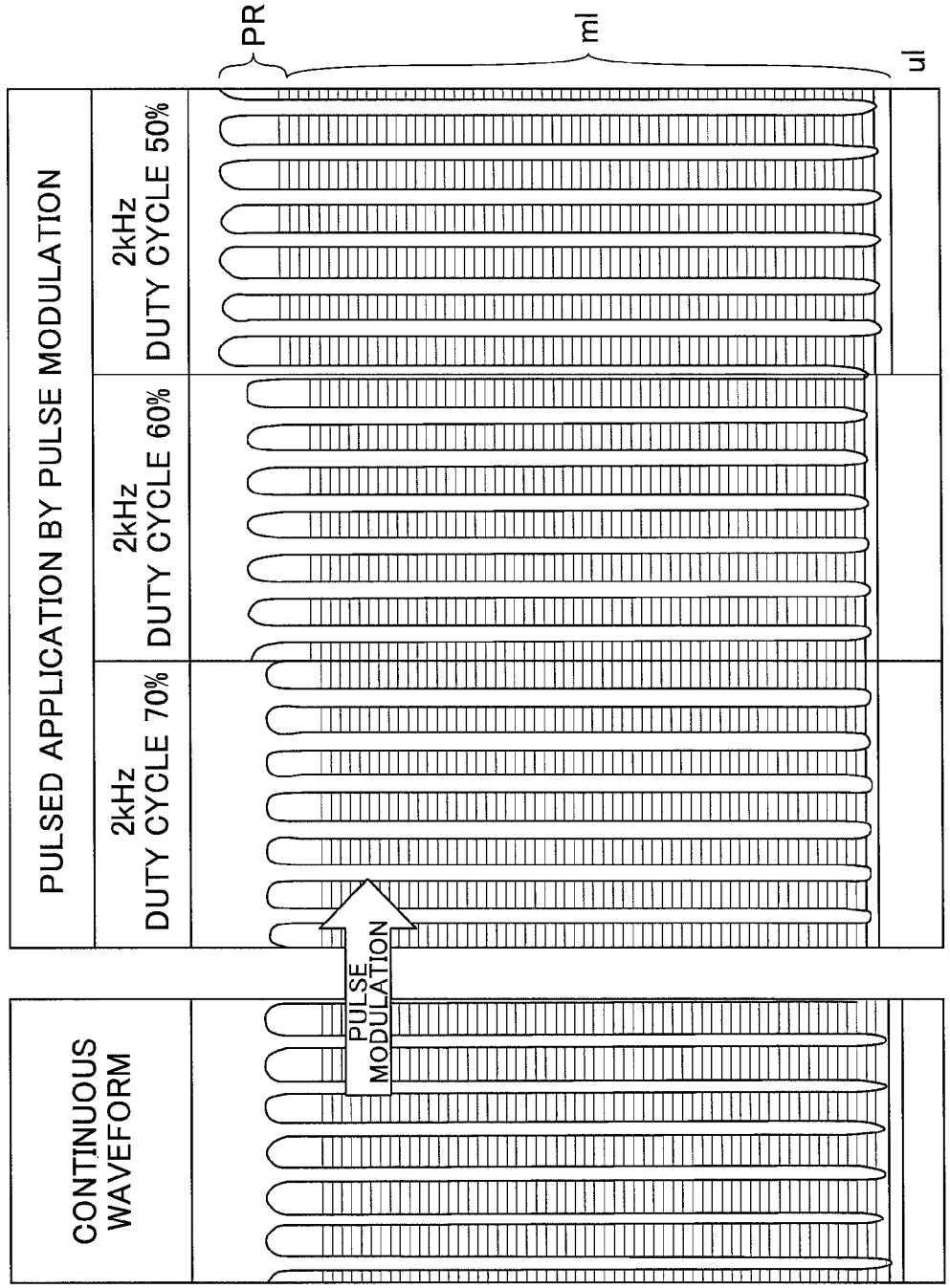
FIG. 6A illustrates results of the etching process according to the embodiment.

In the over etching process OE of the present embodiment, pulse modulation is performed on the continuous waveform of the second high frequency power for biasing. That is, upon executing the over etching process OE in the present embodiment, the second high frequency power output from the second high frequency power supply 31 is applied in pulses. In the following, experimental results of applying the second high frequency power in pulses are illustrated in comparison to a case of applying the second high frequency power as a continuous waveform. FIG. 6A illustrates schematic representations of SEM (scanning electron microscope) images of the plurality of deep holes formed by executing the above etching process through application of the second high frequency power as a continuous waveform and application of the second high frequency power in pulses. As illustrated in FIG. 6A, the film structure subject to the etching process includes the photoresist layer PR, the multilayer film ml (stacked film) having the $SiO_2$ film corresponding to the first film 110 and the polysilicon (impurity doped) film corresponding to the second film 120 alternatingly stacked one on top of the other, and the base film ul. Each layer constituting the multilayer film ml (stacked film) may have a thickness of approximately 30 nm, and the stacked film may be made up of 36 layers, for example. Note, however, that the thickness of each layer and the number of layers making up the stacked film is not limited to the above example. The base film ul may be made of a high-k material, for example. The photoresist layer PR is used as a mask to form the plurality of holes at the multilayer film ml.

Note that FIGS. 6A and 6B illustrate a case where the second high frequency power for biasing is discharged as a continuous waveform, and cases where the second high frequency power is discharged in pulses at a duty cycle of 70%, a duty cycle of 60%, and a duty cycle of 50%. In the case where the duty cycle is 70%, the second high frequency power for biasing is applied (on) 70% of the time and not applied (off) 30% of the time. Also, the pulse modulation of the second high frequency power is performed at a frequency of 2 kHz.

(Residual Film of Photoresist Layer PR)

Figure 7:
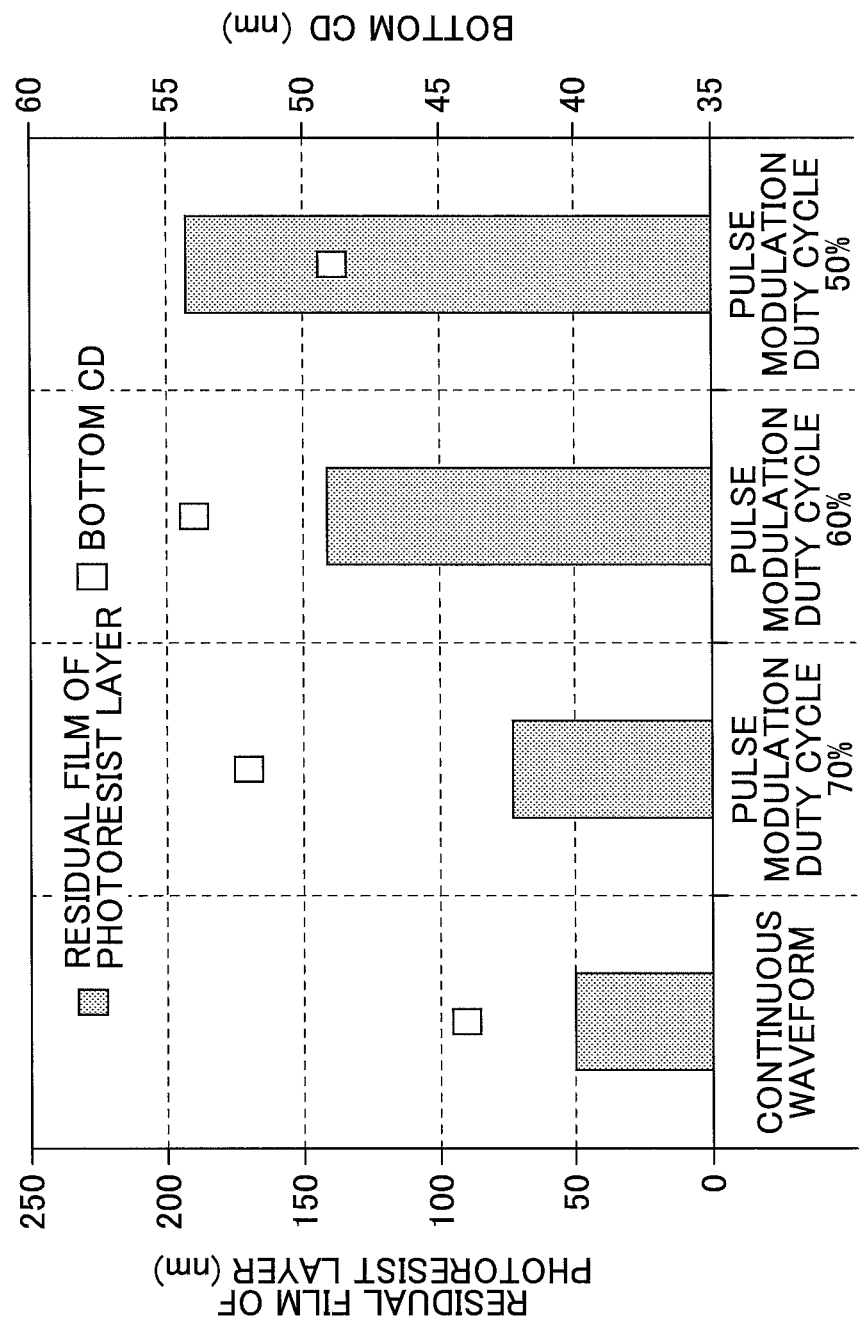
FIG. 7 is a graph representing the results of the etching process according to the embodiment.

FIG. 7 is a graph representing the etching results of FIGS. 6A and 6B. Referring to the bars representing the residual film of the photoresist film PR in the graph of FIG. 7, it can be appreciated that a greater portion of the photoresist film PR remains when the second high frequency power is applied in pulses compared to the case where the second high frequency power is applied as a continuous waveform. Because the thickness of the stacked film is the same in all cases, this indicates that the photoresist layer selectivity corresponding to the ratio of the etching rate of the photoresist layer PR with respect to the etching rate of the stacked film is increased. In other words, the greater the portion of the photoresist layer PR remaining, the higher the photoresist layer selectivity. Also, this indicates that the portion of the photoresist layer PR remaining (residual film) may be controlled by adjusting the duty cycle. Specifically, as the duty cycle is decreased, the residual film is increased. That is, as the duty cycle is decreased, the time period during which the second high frequency power is applied becomes shorter, and while the second high frequency power is not applied, the photoresist layer PR is not attacked by ions so that etching may be suppressed. Thus, the portion of the photoresist layer PR remaining (residual film) may be increased as the duty cycle is decreased. Upon comparing the residual film of the photoresist film PR resulting from a pulsed discharge with the residual film of the photoresist film PR resulting from application of the continuous waveform in FIG. 7, it can be appreciated that the residual film of the photoresist film PR is increased approximately 1.5 times in the case where the duty cycle is 70%, approximately 3 times in the case where the duty cycle is 60%, and approximately 4 times in the case where the duty cycle is 50%.

(Bottom CD)

As described above, when the second high frequency power is applied as a continuous waveform and positive ions are continuously implanted into the stacked film, the bottom portion of the hole is positively charged. When positive ions are further implanted in such a state, the positive charges at the bottom portion of the hole and the positive ions being implanted react with one another. As a result, ions may be prevented from penetrating into the bottom portion of the hole. That is, the bottom portion of the hole may not be etched.

Accordingly, in the present embodiment, high speed pulse modulation is implemented to enable pulsed application of the second high frequency power for biasing. In this way, the positive charges attracted to the bottom portion of the hole while the second high frequency power is applied may be discharged while the second high frequency power is not applied. That is, by applying the second high frequency power in pulses, positive charges accumulating at the bottom portion of the hole may be reduced. Accordingly, reaction between the positive charges and the positive ions may be suppressed, and implantation of the positive ions into the bottom portion of the hole may be facilitated. As a result, etching of the bottom portion of the hole may be stimulated and the bottom CD of the bottom portion of the hole may be enlarged.

Referring to the dots representing the bottom CD in the graph of FIG. 7, it can be appreciated that in the case where pulsed discharge of the second high frequency power is performed, the bottom CD is greater compared to the case where the continuous waveform is applied. That is, the holes formed at the stacked film may be straightened and the diameter of the bottom CD may be enlarged by performing pulsed discharge of the second high frequency power.

As can be appreciated from the above, by applying the second high frequency power in pulses, a desirable photoresist layer selectivity may be achieved. In addition, by applying the second high frequency power for biasing in pulses, the diameter of the bottom CD may be enlarged compared to the case where the second high frequency power is applied as a continuous waveform.

Note that the bottom CD may be obtained by measuring the CD at the lowermost layer of the multilayer film ml or measuring a layer placed a few layers above the lowermost layer, for example.

Also, note that although pulse modulation and pulsed application of the second high frequency power for biasing is performed upon executing the over etching process OE in the present embodiment, the present invention is not limited to such a case. In some embodiments, pulse modulation and pulsed application of the second high frequency power may be performed throughout the entire etching process from the main etching processes ME to the over etching process OE, for example. In other embodiments, pulse modulation and pulsed application of the second high frequency power may be started at some point between executing the main etching processes ME and continued up to the over etching process OE. That is, according to an aspect of the present invention, pulse modulation and pulsed application of the second high frequency power is performed at least during the over etching process OE to efficiently enlarge the bottom CD at the bottom portion of the hole.

(Duty Cycle of Pulse Modulation)

In the present embodiment, the second high frequency power for biasing is pulse-modulated at a duty cycle within a range of 50-70% and at a modulation frequency of 2 kHz, and the pulsed second high frequency power is applied to the lower electrode (mounting table 12). Note that when the second high frequency power for biasing was pulse modulated at a frequency of 2 kHz, significant property improvements could be achieved compared to the case of applying the continuous waveform. Based on the above, according to preferred embodiments of the present invention, the second high frequency power for biasing applied to the lower electrode from the second high frequency power 31 is pulse modulated at a duty cycle within a range of 50-70% and a modulation frequency within a range of 0.2-10 kHz.

However, in other embodiments, the second high frequency power for biasing may be pulse modulated at a duty cycle within a range of 20-80% and a modulation frequency within a range of 0.2-10 kHz. In other words, the second high frequency power for biasing has to be pulse modulated at a duty cycle of at least 20%. When the high frequency power is pulse modulated at a duty cycle of 0-20%, the high frequency power is applied for only a short period of no more than 20% of the time, and as a result, etching may not be adequately performed and throughput may be degraded. Also, the second high frequency power for biasing has to be pulse modulated at a duty cycle of no more than 80%. When the high frequency power for biasing is modulated at a duty cycle of 80-100%, the high frequency power is applied 80% of the time or longer, and as a result, positive charges may remain at the bottom portion of the hole and etching of the bottom portion of the hole may be hindered as in the case of applying the continuous waveform. Thus, the bottom CD may not be enlarged as desired.

(Frequency of High Frequency Power)

In the following, the frequency of the second high frequency power for biasing is described with reference to FIGS. 8A, 8B, and 9. In the present example, the frequency of the second high frequency power for biasing was set to 3.2 MHz and 400 kHz in an etching process of the present embodiment and etching results were compared. Specific process conditions used in the present example are described below.

<Common Process Conditions>

| Pressure | 50 mTorr (6.6661 Pa) |
| --- | --- |
| First High Frequency Power Frequency/Power | 60 MHz/2000 W (283.1 W/cm$^2$) |
| Gas Type & Gas Flow Rate | HBr/C$_4$F$_8$/Ar = 500/30~26/100 sccm |

<Individual Process Conditions>

(Etching Process 1)

| Second High Frequency Power Frequency/Power | 3.2 MHz/4000 W (566.2 W/cm$^2$) |
| --- | --- |

(Etching Process 2)

| Second High Frequency Power Frequency/Power | 3.2 MHz/5300 W (707.8 W/cm$^2$) |
| --- | --- |

(Etching Process 3)

| Second High Frequency Power Frequency/Power | 400 kHz/4000 W (566.2 W/cm$^2$) |
| --- | --- |

(Etching Process 4)

| Second High Frequency Power Frequency/Power | 400 kHz/4500 W (637.0 W/cm$^2$) |
| --- | --- |

Figure 8A:
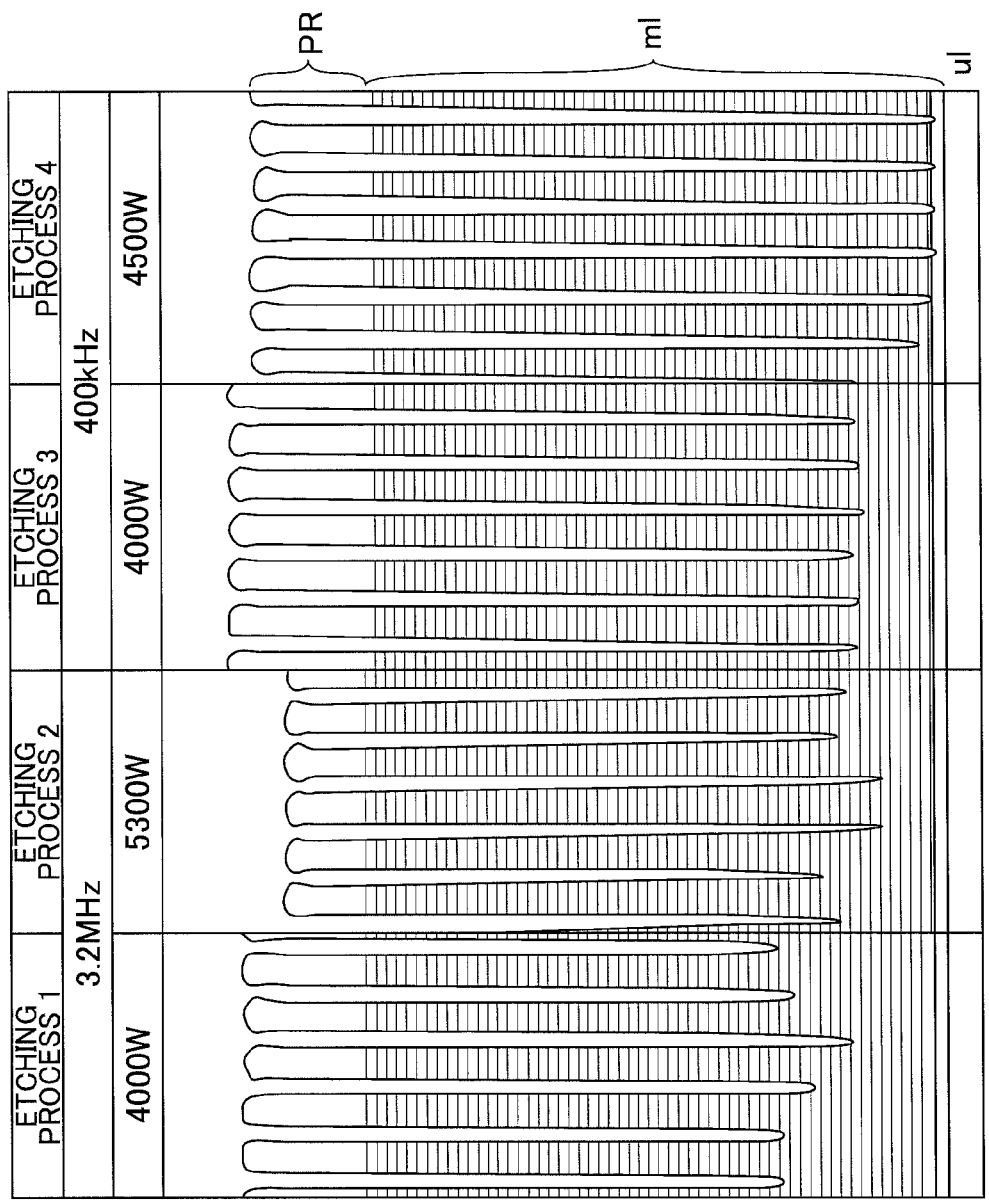
FIG. 8A illustrates results of the etching process of the embodiment when different frequencies and powers are used.

FIGS. 8A and 8B illustrate the etching results of executing etching processes 1 through 4. FIG. 8A illustrates a schematic representation of SEM (scanning electron microscope) images of a plurality of holes formed by the etching processes 1 through 4. As illustrated in FIG. 8A, the film structure subject to the etching processes includes the photoresist layer PR, the multilayer film ml (stacked film) having the SiO$_2$ film corresponding to the first film 110 and the polysilicon (impurity doped) film corresponding to the second film 120 alternatingly stacked one on top of the other, and the base film ul. The photoresist layer PR is used as a mask to form the plurality of holes in the multilayer film ml.

Figure 9:
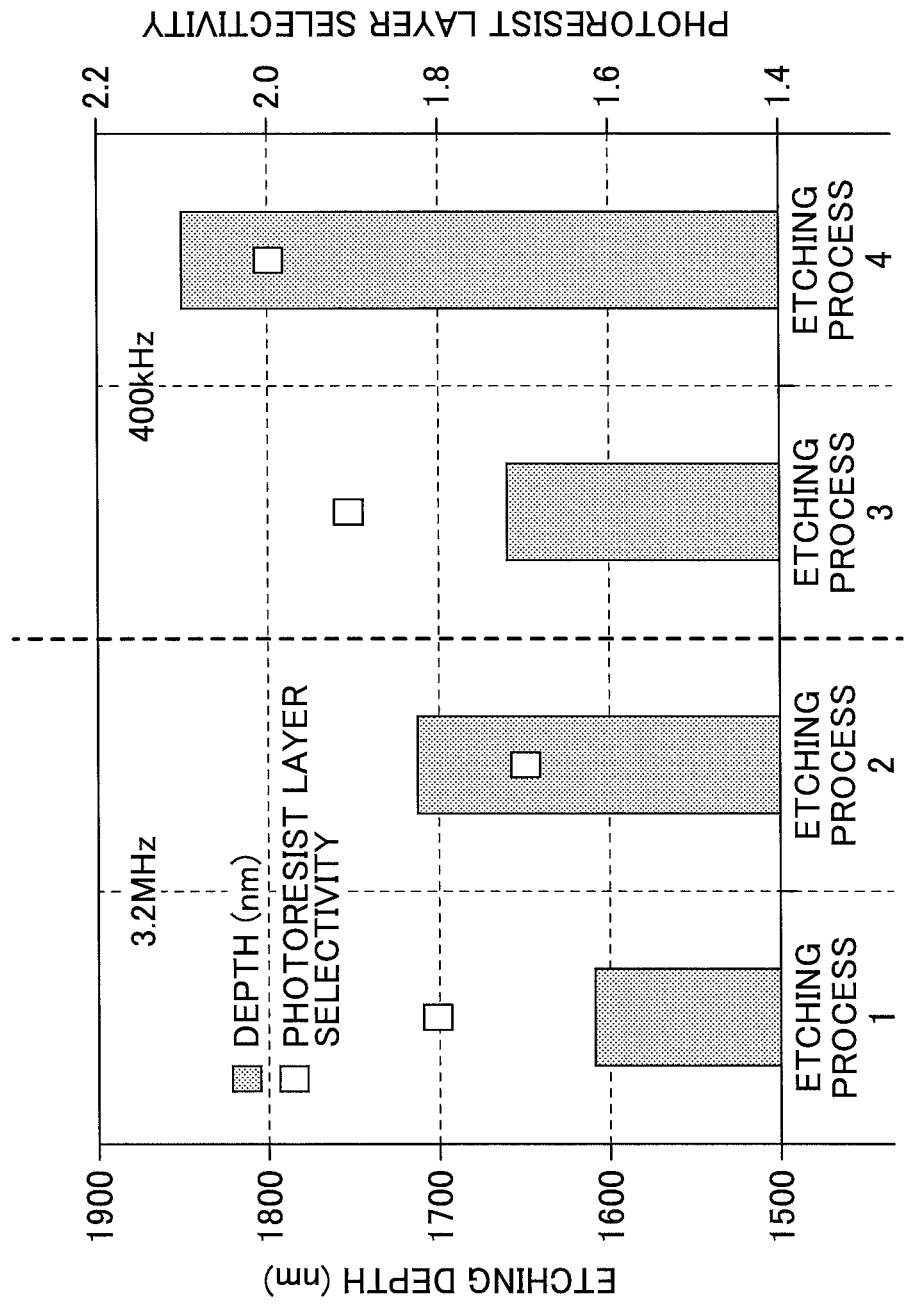
FIG. 9 is a graph representing the results of the etching process of the embodiment when different frequencies and powers are used.

FIG. 9 is a graph representing the etching results of FIGS. 8A and 8B. Referring to FIGS. 8A, 8B, and 9, it can be appreciated that deeper holes may be etched and a higher photoresist layer selectivity may be achieved in the case where the etching process 4 with "second high frequency power frequency/power=400 kHz/4500 W (637.0 W/cm$^2$)" is executed compared to the case where the etching process 2 with "second high frequency power frequency/power=3.2 MHz/5300 W (707.8 W/cm$^2$)" is executed. This indicates that deeper holes may be etched under the condition where the frequency of the second high frequency power is 400 kHz and its power is 4500 W compared to the condition where the frequency of the second high frequency power is 3.2 MHz and its power is 5300 W. That is, when the frequency of the second high frequency power is 3.2 MHz, holes may not be deeply etched even when the second high frequency power is set to a high power of 5300 W. When the frequency of the second high frequency power is 400 kHz, deeper holes may be etched compared to the case where the frequency is 3.2 MHz even when the power of the second high frequency power is 4500 W, which is lower than 5300 W.

Also, it can be appreciated that a higher photoresist layer selectivity can be achieved and a smaller portion of the photoresist layer PR is removed under the condition where the frequency of the second high frequency power is 400 kHz and its power is 4500 W compared to the condition where the frequency of the second high frequency power is 3.2 MHz and its power is 5300 W.

When the second high frequency power for biasing is applied, a negative voltage is applied to the lower electrode and ions within plasma are drawn toward the lower electrode. In this way, the ions within the plasma are bombarded into a pattern (a plurality of holes in the present example) formed by the photoresist layer PR and holes are gradually etched to a greater depth beneath the photoresist layer PR.

When the second high frequency power for biasing is 400 kHz, a higher voltage is applied to a sheath region compared to the case where the second high frequency power for biasing is 3.2 MHz. Thus, when the second high frequency power for biasing is 400 kHz, the ions within the plasma are accelerated at a higher rate within the sheath region compared to the case where the second high frequency power for biasing is 3.2 MHz. As a result, when the second high frequency power for biasing is 400 kHz, a greater diameter may be secured as the bottom CD, holes may be etched to a greater depth, and the photoresist layer selectivity may be increased. On the other hand, when the second high frequency power for biasing is 3.2 MHz, the diameter of the bottom CD may not be enlarged as desired such that adequately deep holes may not be etched and the photoresist layer selectivity cannot be increased.

Modified Embodiment

In the following, a modification of the present embodiment is described. In the above embodiment, the types of gases used in the main etching processes ME are $HBr/C_4F_8/Ar$. In the present modified embodiment, carbonyl sulfide or sulfur hexafluoride is added to the above the types of gases used in the main etching processes ME. Specific process conditions of the present modified embodiment are indicated below.

<Main Etching Process ME1>

| Pressure | 50 mTorr (6.6661 Pa) |
| --- | --- |
| First High Frequency Power/ Second High Frequency Power | 2000/4500 W (283.1/636.9 W/cm²) |
| Gas Type & Gas Flow Rate | $HBr/C_4F_8/SF_6$ or COS/Ar = 496/40/25/100 sccm |

<Main Etching Process ME2>

| Pressure | 50 mTorr |
| --- | --- |
| First High Frequency Power/ Second High Frequency Power | 2000/4500 W |
| Gas Type & Gas Flow Rate | $HBr/C_4F_8/SF_6$ or COS/Ar = 496/36/25/100 sccm |

<Main Etching Process ME3>

| Pressure | 50 mTorr |
| --- | --- |
| First High Frequency Power/ Second High Frequency Power | 2000/4500 W |
| Gas Type & Gas Flow Rate | $HBr/C_4F_8/SF_6$ or COS/Ar = 496/32/25/100 sccm |

<Main Etching Process ME4>

| Pressure | 50 mTorr |
| --- | --- |
| First High Frequency Power/ Second High Frequency Power | 2000/4500 W |
| Gas Type & Gas Flow Rate | $HBr/C_4F_8/SF_6$ or COS/Ar = 496/28/25/100 sccm |

<Over Etching Process OE>

| Pressure | 50 mTorr |
| --- | --- |
| First High Frequency Power/ Second High Frequency Power | 1500/1000 W (212.3/141.5 W/cm²) |
| Gas Type & Gas Flow Rate | $HBr/Ar/NF_3/CH_4$ = 450/450/25/60 sccm |

In the present modified embodiment, $SF_6$ or COS is added to the types of gases used in the main etching processes ME1-ME4 so that sulfide deposits may act as a protective film particularly for the polysilicon (impurity doped) film corresponding to the second film 120. In this way, the present modified embodiment may address the problem of asperities generated at the holes formed in the stacked film as a result of the polysilicon film being excessively etched with respect to the silicon oxide ($SiO_2$) film corresponding to the first film.

The above aspect of the present modified embodiment is described below with reference to FIG. 10. In FIG. 10, S10 represents an etching result in a case where $SF_6$ or COS is not added to the types of gases $HBr/C_4F_8/Ar$ used in the main etching processes ME. In this case, side etching of the polysilicon film 120 occurs and asperities are generated at the holes formed in the stacked film.

On the other hand, S20 of FIG. 10 represents an etching result of the present modified embodiment in which $SF_6$ or COS is added to the types of gases $HBr/C_4F_8/Ar$ used in the main etching processes ME1-ME4. In this case, side etching of the polysilicon film 120 occurring in S10 of FIG. 10 may be suppressed such that asperities may not be generated at the holes formed at the stacked film. That is, by adding $SF_6$ gas or COS gas to the etching gas, sulfide deposits may act as a protective film for the polysilicon film such that side etching of the polysilicon film may be prevented and asperities generated at the side face of the etched holes may be reduced. Note that the gas added to the types of gases $HBr/C_4F_8/Ar$ used in the main etching processes ME is not limited to $SF_6$ gas or COS gas but may be any gas containing sulfur (S) such as $SO_2$.

Note that $SF_6$ gas is preferably added at a gas flow rate of 20-100 sccm. Similarly, COS gas is preferably added at a gas flow rate of 20-100 sccm. Also, by performing pulse modulation and pulsed application of the second high frequency power in the over etching process OE, the bottom CD may be enlarged.

[Effects]

As described above, according to preferred embodiments of the present invention, etching is performed on the multilayer ml under the following process conditions (1)~(6).

(1) Etching is performed using a parallel plate type plasma processing apparatus (CCP plasma processing apparatus) having an upper electrode and a lower electrode.

(2) A first high frequency power for plasma generation that is greater than or equal to 27 MHz is applied to the lower electrode from the first high frequency power supply 31, and a second high frequency power for biasing that is greater than or equal to 380 kHz and less than or equal to 1 MHz is applied to the lower electrode from the second high frequency power supply 32.

(3) The multilayer film ml having the first film 110 and the second film 120 with differing dielectric constants alternatingly stacked on a base film ul is etched using plasma to form a hole or a trench with a predetermined shape at the multilayer film ml.

(4) The multilayer film ml is etched by a first step of etching the multilayer film ml to a first depth using a gas mixture containing a CF based gas at a first flow rate and a gas including at least one of a bromine-containing gas, a chlorine-containing gas, and an iodine-containing gas.

(5) After the first step, the multilayer film ml is etched by a second step of etching the multilayer film ml to a second depth, which differs from the first depth, using a gas mixture containing the CF based gas at a second flow rate, which differs from the first flow rate, and the gas including at least one of the bromine-containing gas, the chlorine-containing gas, and the iodine-containing gas.

(6) After the first step and the second step, an over etching process is performed for etching the multilayer film ml until the hole or the trench reaches the base film ul (base layer) of the multilayer film ml.

By implementing the above process conditions, the photoresist layer selectivity may be increased and the photoresist layer PR may be prevented from disappearing before the deep hole reaches the base film ul. Also, even when the depth of the hole to be etched is increased, an adequately large bottom CD may be secured at the bottom portion of the hole. That is, an etching method that is capable of enlarging the diameter of the bottom CD may be provided. In this way, even when the number of layers making up the stacked film is greater than or equal to 20, the diameter of the bottom CD may be enlarged and deep holes with a desirable shape may be formed in the stacked film.

Although illustrative embodiments of the present invention have been described above with reference to the accompanying drawings, a manufacturing method of a semiconductor manufacturing apparatus and a semiconductor manufacturing apparatus according to the present invention are not limited to these embodiments. That is, numerous variations and modifications will readily occur to those skilled in the art, and the present invention includes all such variations and modifications that may be made without departing from the scope of the present invention.

For example, although the embodiment described above relates to forming holes in a stacked film, a manufacturing method of a semiconductor manufacturing apparatus according to the present invention may also be applied to a case of forming lines and spaces (L&S) in a stacked film.

Also, a manufacturing method of a semiconductor manufacturing apparatus according to an embodiment of the present invention may include a first step of etching the multilayer film to a first depth using plasma generated from a gas mixture containing a CF based gas at a first flow rate and a gas including at least one of a bromine-containing gas, a chloride-containing gas, and an iodine-containing gas; a second step of etching the multilayer film after the first step, the second step including etching the multilayer film to a second depth, which differs from the first depth, using plasma generated from a gas mixture containing the CF based gas at a second flow rate, which differs from the first flow rate, and the gas including at least one of the bromine-containing gas, the chloride-containing gas, and the iodine-containing gas; and a third step of over etching the multilayer film after the second step until the hole or the trench reaches a base layer of the multilayer film. At least the third step may include applying the second high frequency power for biasing to the lower electrode in pulses.

Further, the second high frequency power applied to the lower electrode in pulses may be applied at a duty cycle within a range of 20-80% and a modulation frequency within a range of 0.2-10 kHz.

Further, the duty cycle of the second high frequency power applied to the lower electrode in pulses may be within a range of 50-70%.

Also, the second flow rate of the CF based gas supplied in the second step may be lower than the first flow rate of the CF based gas supplied in the first step.

Further, a manufacturing method of a semiconductor manufacturing apparatus according to an embodiment of the present invention may include a fourth step of etching the multilayer film after the first step and the second step, and before the third step. The fourth step may include etching the multilayer film to a third depth using plasma generated from a gas mixture containing the CF based gas at a third flow rate and the gas including at least one of the bromine-containing gas, the chloride-containing gas, and the iodine-containing gas. The third flow rate may be even lower than the second flow rate.

Also, the third step may include over etching the multilayer film using a gas mixture including a bromine-containing gas, a fluoride-containing gas, and a hydrogen-and-carbon-containing gas.

Also, at least one of the gas mixture used in the first step, the gas mixture used in the second step, and the gas mixture used in the third step may include an inert gas.

Also, the gas mixture used in the first step and the gas mixture used in the second step may include a sulfur-containing gas.

Further, the gas mixture used in the first step and the gas mixture used in the second step may include carbonyl sulfide or sulfur hexafluoride.

Also, the first film may correspond to a silicon oxide film and the second film may correspond to a polysilicon film.

Also, the multilayer film may have at least twenty layers of the first film and the second film alternatingly stacked on the base film.

Also, the workpiece subject to a plasma process in the present invention is not limited to a semiconductor wafer but may be a large substrate for a flat panel display (FPD), an electroluminescence (EL) element, or a substrate for a solar battery, for example.

The present application is based on and claims the benefit of priority of Japanese Patent Application No. 2012-025830 filed on Feb. 9, 2012; U.S. Provisional Application No. 61/597,876 filed on Feb. 13, 2012; Japanese Patent Application No. 2012-086576 filed on Apr. 5, 2012; and U.S. Provisional Application No. 61/622,052 filed on Apr. 10, 2012, the entire contents of which are herein incorporated by reference.

DESCRIPTION OF THE REFERENCE NUMERALS

10 plasma processing apparatus
11 chamber
12 mounting table (lower electrode)
31 second high frequency power supply (for biasing)
32 first high frequency power supply (for plasma generation)
38 shower head (upper electrode)
62 gas supply source
80 control device
105 process execution unit
110 first film
120 second film
PR photoresist film
ml multilayer film
ul base film

The invention claimed is:

1. A plasma processing method for etching a multilayer film having a first film and a second film with differing dielectric constants alternatingly stacked on a substrate using plasma of a processing gas, and forming a hole or a trench with a predetermined shape in the multilayer film, the plasma processing method comprising:

applying to a lower electrode, which is arranged opposite an upper electrode, a first high frequency power for plasma generation that is greater than or equal to 27 MHz, and a second high frequency power for biasing that is greater than or equal to 380 kHz and less than or equal to 1 MHz;

a first step of etching the multilayer film to a first depth using plasma of a first processing gas generated from a gas mixture containing a CF based gas at a first flow rate and a gas including at least one of a bromine-containing gas, a chloride-containing gas, and an iodine-containing gas;

a second step of etching the multilayer film after the first step, the second step including etching the multilayer film to a second depth, which differs from the first depth, using plasma of a second processing gas generated from a gas mixture containing the CF based gas at a second flow rate, which differs from the first flow rate, and the gas including at least one of the bromine-containing gas, the chloride-containing gas, and the iodine-containing gas; and a third step of over etching the multilayer film after the second step while using plasma of a third processing gas comprising a $NF_3$ gas and a $CH_4$ gas until the hole or the trench reaches a base layer of the multilayer film, wherein, in the third step, the second high frequency power for biasing has a value smaller than a value of the second high frequency power for both of the first step and the second step.

2. The plasma processing method as claimed in claim 1, wherein at least the third step includes applying the second high frequency power for biasing to the lower electrode in pulses.

3. The plasma processing method as claimed in claim 2, wherein the second high frequency power applied to the lower electrode in pulses is applied at a duty cycle within a range of 20-80% and a modulation frequency within a range of 0.2-10 kHz.

4. The plasma processing method as claimed in claim 3, wherein the duty cycle of the second high frequency power applied to the lower electrode in pulses is within a range of 50-70%.

5. The plasma processing method as claimed in claim 1, wherein the second flow rate of the CF based gas supplied in the second step is lower than the first flow rate of the CF based gas supplied in the first step.

6. The plasma processing method as claimed in claim 5, further comprising: a fourth step of etching the multilayer film after the first step and the second step, and before the third step, the fourth step including etching the multilayer film to a third depth using plasma generated from a gas mixture containing the CF based gas at a third flow rate and the gas including at least one of the bromine-containing gas, the chloride-containing gas, and the iodine-containing gas; wherein the third flow rate is lower than the second flow rate.

7. The plasma processing method as claimed in claim 1, wherein at least one of the gas mixture used in the first step, the gas mixture used in the second step, and the gas mixture used in the third step includes an inert gas.

8. The plasma processing method as claimed in claim 1, wherein the gas mixture used in the first step and the gas mixture used in the second step include a sulfur-containing gas.

9. The plasma processing method as claimed in claim 8, wherein the gas mixture used in the first step and the gas mixture used in the second step include carbonyl sulfide or sulfur hexafluoride.

10. The plasma processing method as claimed in claim 1, wherein the first film corresponds to a silicon oxide film and the second film corresponds to a polysilicon film.

11. The plasma processing method as claimed in claim 1, wherein the multilayer film has at least twenty layers of the first film and the second film alternatingly stacked on the substrate.

12. The plasma processing method as claimed in claim 1, wherein, in the third step, the second high frequency power for biasing has a value smaller than a value of the second high frequency power for the first step and the second step.

* * * * *